(12) United States Patent
Tsai

(10) Patent No.: US 6,573,610 B1
(45) Date of Patent: Jun. 3, 2003

(54) SUBSTRATE OF SEMICONDUCTOR PACKAGE FOR FLIP CHIP PACKAGE

(75) Inventor: Ying Chou Tsai, Taichung (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 0 days.

(21) Appl. No.: 09/586,300

(22) Filed: Jun. 2, 2000

(51) Int. Cl.⁷ .................. H01L 23/48; H01L 23/52; H01L 29/40
(52) U.S. Cl. .................. 257/780; 257/779; 257/778
(58) Field of Search .................. 257/780, 781, 257/783, 789, 795, 737, 778, 779, 784

(56) References Cited

U.S. PATENT DOCUMENTS

| | | | | |
|---|---|---|---|---|
| 5,615,477 A | * | 4/1997 | Sweitzer | |
| 5,936,848 A | * | 8/1999 | Mehr et al. | |
| 5,962,921 A | * | 10/1999 | Farnworth et al. | |
| 6,046,909 A | * | 4/2000 | Joy | |
| 6,086,386 A | * | 7/2000 | Fjelstsad | |
| 6,140,707 A | * | 10/2000 | Plepys et al. | |
| 6,180,504 B1 | * | 1/2001 | Farnworth et al. | |
| 6,187,610 B1 | * | 2/2001 | Armezzani et al. | |
| 6,194,781 B1 | * | 2/2001 | Ikegami | |
| 6,232,152 B1 | * | 5/2001 | DiStefano et al. | |
| 6,232,666 B1 | * | 5/2001 | Coursis et al. | |

* cited by examiner

Primary Examiner—Sheila V. Clark

(57) ABSTRACT

A semiconductor package structure for Flip Chip package includes at least an insulative core layer and a plurality of patterned circuit layers alternately stacking up each other. The patterned circuit layers are electrically connected each other wherein one of the patterned circuit layers is positioned on the surface of the substrate. The patterned circuit layer includes a plurality of bump pads, and each of the bump pads has an etching hole. The solder mask layer covers the surface of the patterned circuit layer and a portion of the surface of the outer edge of the bump pads, and exposes the etching holes. The solder mask layer may also expose the whole surface of the bump pads.

16 Claims, 7 Drawing Sheets

SUBSTRATE OF SEMICONDUCTOR PACKAGE FOR FLIP CHIP PACKAGE

BACKGROUND OF THE INVENTION

1. Field of the Invention

This invention relates to a substrate of semiconductor package for Flip Chip package, and more particularly to a substrate of semiconductor package for Flip Chip package having bump pad with etching hole.

2. Description of Related Art

In the information explosion of the world nowadays, the integrated circuit has become indispensable in our daily life, regardless of our daily life in food, clothing, lodging, transportation, education, and entertainment, the product assembled by various integrated circuit devices can be found. everywhere. Following the evolution of the electronic technology, more sophisticate electronic products with user friendly and complicated functions are continuously progressing and changing. Nevertheless, in order to provide an ongoing convenience and comfortable usage, all the products are heading for the design trend of "Light, Thin, Short, and Small". In addition, the fabrication process of semiconductor has stepped into the mass production era of 0.18 $\mu$m integrated circuit, and semiconductor products with even higher integration have become at hands easily. As for packaging technology of the back end semiconductor process, there are many successful cases on the development of precise package structure, i.e. chip scale package (CSP), wafer level package, and Multi-Chip Module (MCM) etc. However, in respect of the assembly technology of devices, there is also a multi-level printed circuit board (PCB) with even higher density which make the integrated circuit (IC) package even closely and densely dispose on the printed circuit board.

Nevertheless, a Flip Chip technology is the one that is frequently used on the package technology of CSP. As the Flip Chip Technology can employ area array to dispose bump pad and be connected to the carrier through a bump, it can reduce the packaging area and shorten the transmission path of the signal. The effect of the current product on the bump's collapse will depend on the extent that the solder mask covers the bump pad. Traditional type of bump pad design of the substrate can be classified into SMD (Solder Mask Define) type and NSMD (Non Solder Mask Define) type. Each of these two types of bump pad design has its own merits and demerits, thereby, there is no verdict on this matter one way or another.

FIG. 1A and FIG. 1B are both a cross-sectional view of a Flip Chip package taking NSMD as an example according to the prior art. As shown in FIG. 1, a plurality of bumps 102 is formed on the active surface 101 of a chip 100. The conventional Flip Chip package structure frequently employs laminate substrate 108 having relatively high integration to be a carrier. Generally, a substrate 110 is composed of a copper foil pattern layer having a plurality of patterns, and an insulative layer alternately stacking up each other, together with etching holes (not shown) for connecting the pattern layers. The substrate 110 has its surface coated With a solder mask layer, and exposes only the bump pads. In this way, the chip 100 is having its active surface 101 attached to the substrate 110 and is electrically connected to bump pads 106 by its bumps 102.

In addition, an underfill material (not shown) is employed to fill the space between the chip 100 and the substrate 110. This is to protect the bumps 102 from being "fatigue collapse" due to the thermal stress resulted from the difference between the coefficient of thermal expansion of the chip 100 and that of substrate 110. Besides, in the Flip Chip package products, since Pb-Sn (Lead-Tin) bumps are in ball shape, and as the chip having bumps formed thereon is attached to the substrate, position offset of either left-offset or right-offset may occur between the bump and the bump pad. Besides, elevation offset generated by the coplanarity due to the substrate itself or between the adjacent bumps may also occur.

As shown in FIG. 1B, a conventional method is to employ a Reflow Process to heat the bump 102 such as Pb-Tin bump to be higher than 183° C. to be melted, and to be heated to be higher than 200° C. to have a good Wetting function. If any elevation offset occurs resulted from the coplanar problems when the chip is placed on the bump pad such that part of the bumps 102 are unable to touch the bump pads 106, or the bumps 102 are able to touch the bump pads 106 but the contact areas are too small to have a good contact between the bumps 102 and the bump pads 106, in this case, although the reflow process is employed to have a lot more time to heat the bumps 102 to be higher than 200° C., the problems of being bad contact or too large in electrical contact resistance between the bumps 102 and bump pads 106 can not yet to be effectively improved. Consequently, the bumps 102 are cracked due to the thermal stress caused by the bad solder joint between the bumps 102 and the bump pads 106, thereby, the electrical conductance is affected and the corresponding yield is low.

SUMMARY OF THE INVENTION

Therefore, it is the one of the objectives of the present invention to provide a substrate of semiconductor package for Flip Chip package to improve the solder joint liability between the bumps and the bump pads, and to raise the yield.

In order to attain the foregoing and other objectives, the present invention provides semiconductor package structure for Flip Chip package that includes at least an insulative core layer and a plurality of patterned circuit layers alternately stacking up each other. The patterned circuit layers are electrically connected each other wherein one of the patterned circuit layers is positioned on the surface of the substrate. The patterned circuit layer includes a plurality of bump pads and each of the bump pads has an etching hole. The solder mask layer covers the surface of the patterned circuit layer and a portion of the surface of the outer edge of the bump pads, and exposes the etching holes. The solder mask layer may also expose the whole surface of the bump pads.

According to a preferred embodiment of the present invention, since the substrate of the semiconductor package for Flip Chip package has etching holes, when the bumps attach the bump pads, the bumps will penetrate into the etching holes. Therefore, the contact area between the bumps and the bump pads is not limited to the top surface of the bump pads, but the contact area also includes the interior surfaces of the etching holes. The contact area between the bumps and the bump pads even includes the side surfaces of the bump pads for NSMD type of package substrate. Since the contact area between the bumps and the bump pads increases, the solder joint reliability can be improved and the yield and the reliability of the package can also be improved.

BRIEF DESCRIPTION OF DRAWINGS

The foregoing and other objectives. characteristics, and advantages of the present invention can be more fully understood by reading the following detailed description of the preferred embodiments, with reference made to the accompanying drawings as follows.

DETAILED DESCRIPTION OF PREFERRED EMBODIMENT

Figure 1A:
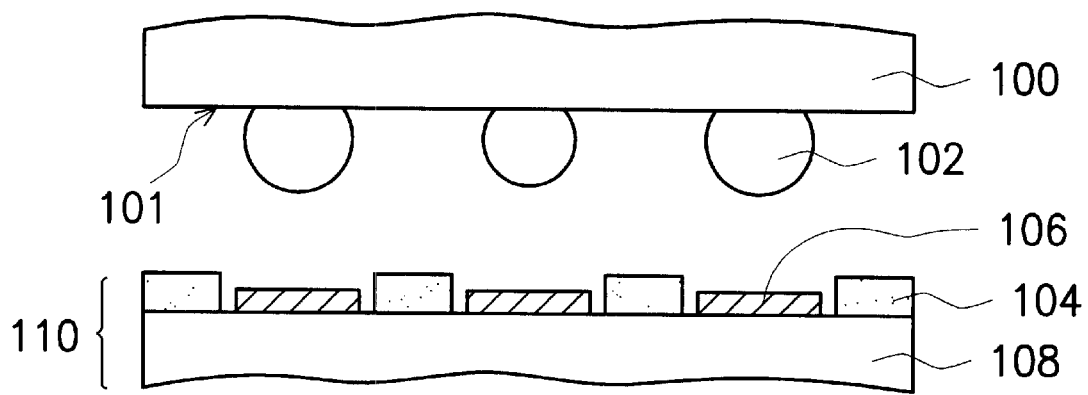
FIG. 1A and FIG. 1B are both a cross-sectional view of a Flip Chip package taking NSMD as an example according to the prior art.
Figure 1B:
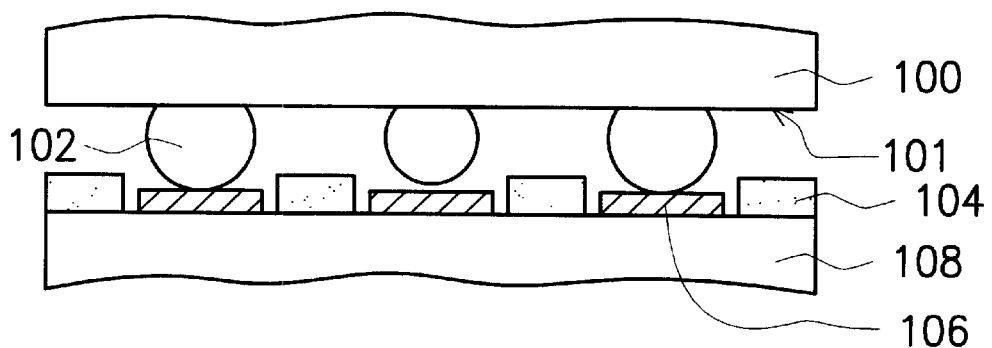
Figure 2A:
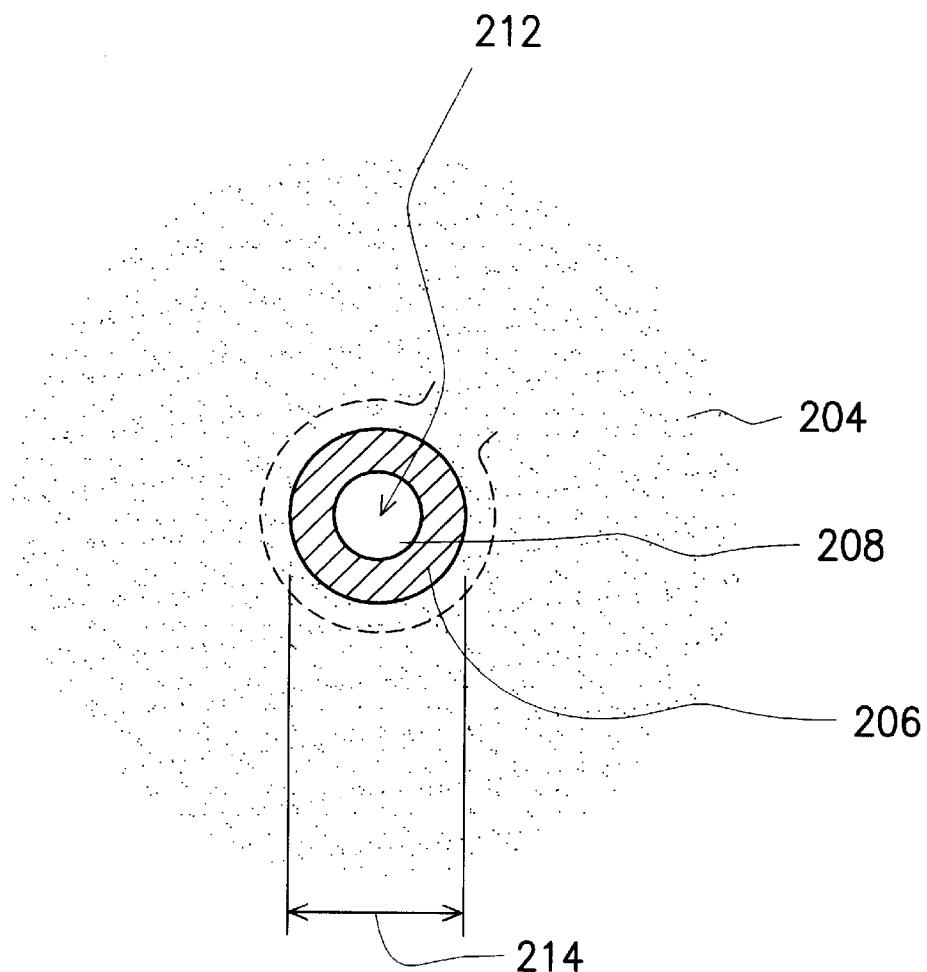
FIG. 2A and FIG. 2B are a plan view and a cross-sectional view respectively of a Flip Chip package taking SMD as an example according to a preferred embodiment of the present invention.
Figure 2B:
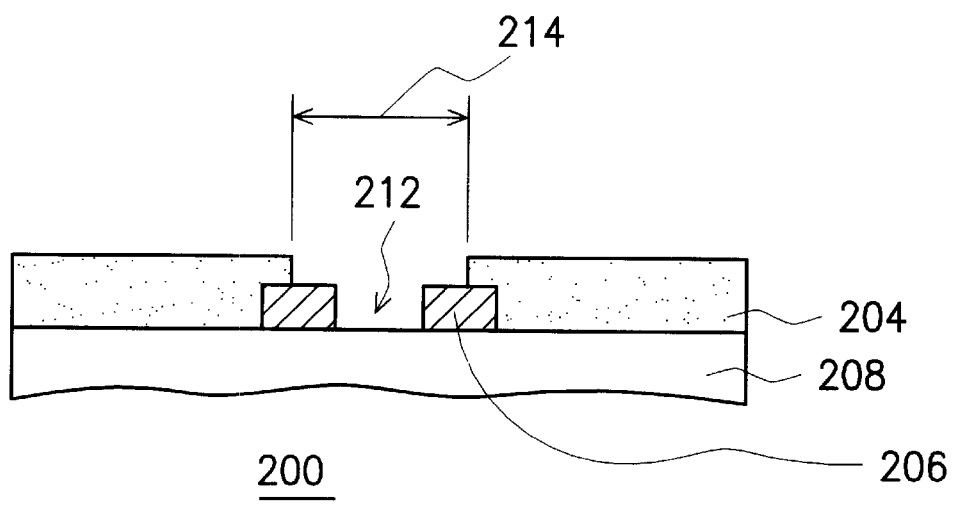

FIG. 2A and FIG. 2B are a plan view and a cross-sectional view respectively of a Flip Chip package taking SMD as an example according to a preferred embodiment of the present invention. As shown in FIGS. 2A and 2B, a package substrate 200 of semiconductor for carrying a chip is formed by an insulative core layer 208 and a patterned circuit layer alternately stacking up each other. The patterned circuit layer on the surface of the substrate 200 includes a plurality of bump pads 206 with etching holes 212 for connecting to the chip. The insulative core layer 208 can employ hard materials such as Prepreg that is made of hard resin having high Glass Transition Temperature (Tg). This kind of material includes "flame-retardant epoxy-glass fabric composite resin", Bismaleimide-Taiazine (BT) etc. such as FR-4 substrate, FR-5 substrate and BT substrate etc. While the material for the patterned circuit layer, i.e. the bump pads 206 includes copper that is formed by definition by the use of photolithographic and etching process.

Subsequently, a solder resistant material is coated on the surface of the substrate 200, having bump pads 204 mounted thereon, to form a solder mask layer 204 so as to cover a portion of the bump pads 204. The solder mask layer 204 has pad opening 214 positioned at the locations corresponding to the bump pads 206. The pad opening 214 exposes a portion of the surface of the bump pad 206 and etching hole 212 so that the solder mask layer 204 covers only the outer edge of the surface of the bump pad 206.

Figure 3A:
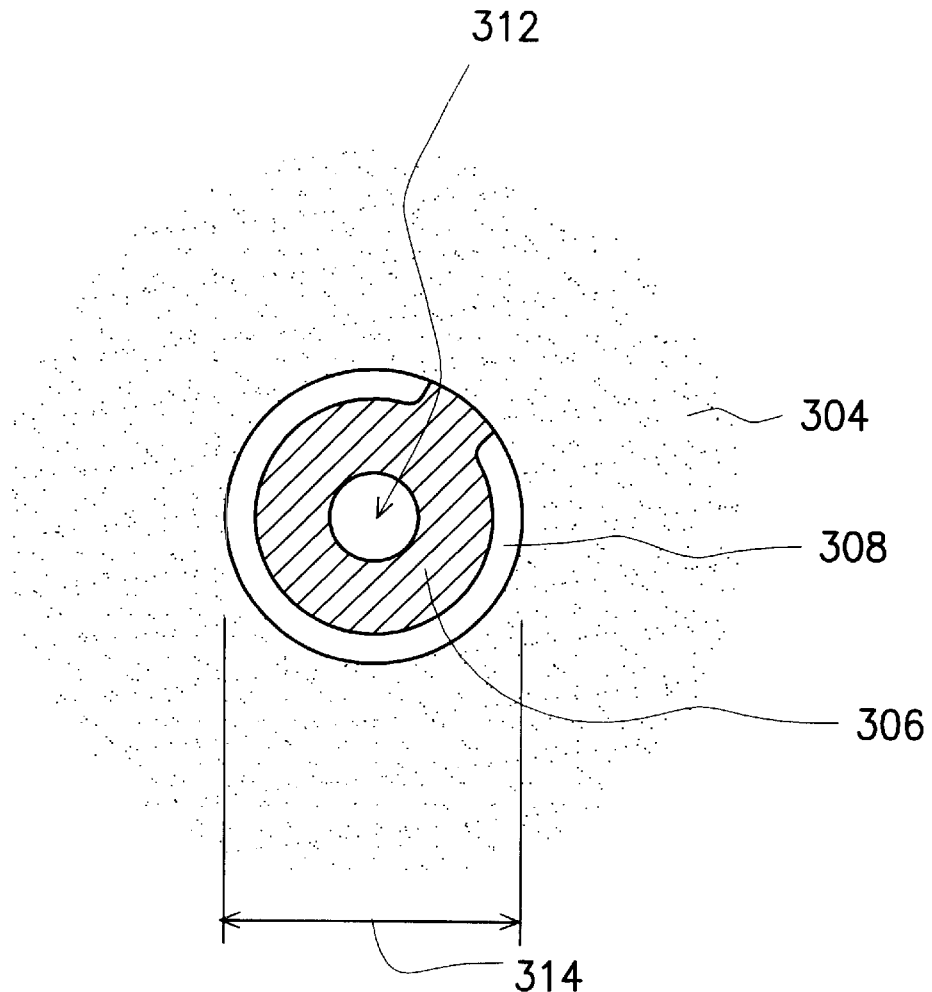
FIG. 3A and FIG. 3B are a plan view and a cross-sectional view respectively of a Flip Chip package taking NSMD as an example according to a preferred embodiment of the present invention.
Figure 3B:
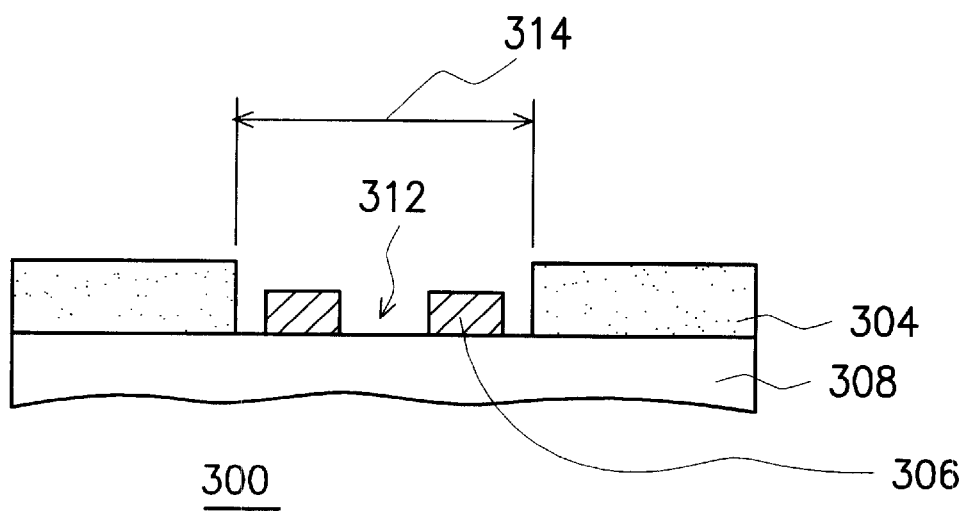

FIG. 3A and FIG. 3B are a plan view and a cross-sectional view respectively of a Flip Chip package taking NSMD as an example according to a preferred embodiment of the present invention. As shown in FIGS. 2A, 2B and FIG. 3A, 3B, generally, substrate bump pad in the design thereof is classified into the SMD type and NSMD type. The difference between them is that the diameter of the pad opening 314 in the solder mask layer 304 of the NSMD type as shown in FIGS. 3A, 3B is larger than that of the pad opening 214 in the solder mask layer 204 of the SMD type as shown in FIGS. 2A, 2B. Besides. the solder mask layer 304 exposes the bump pads 306 and etching holes 312 completely, and there is a clearance reserved between the edge of the pad opening 314 and the edge of the bump pad 306 such that this portion of the insulative core layer 308 is exposed.

The material for forming the solder mask layer 204, 304 is an insulative material that includes ultraviolet type of solder mask and thermoset type of solder mask. The method for forming solder mask layer by coating solder mask includes roller coating, curtain coating, screen curtain, dipping, and dry film. For instance, the solder mask layer 304 is formed by the use of ultraviolet type of solder mask to coat the solder mask on the surface of the substrate 300, then it goes through a first drying, exposing, and developing process as well as a second drying process etc. Also for another example, the solder mask layer 304 can be formed by the use of thermoset type of solder mask to coat the solder mask on the surface of the substrate 300 in accordance with the required pattern of the solder mask layer.

Figure 4A:
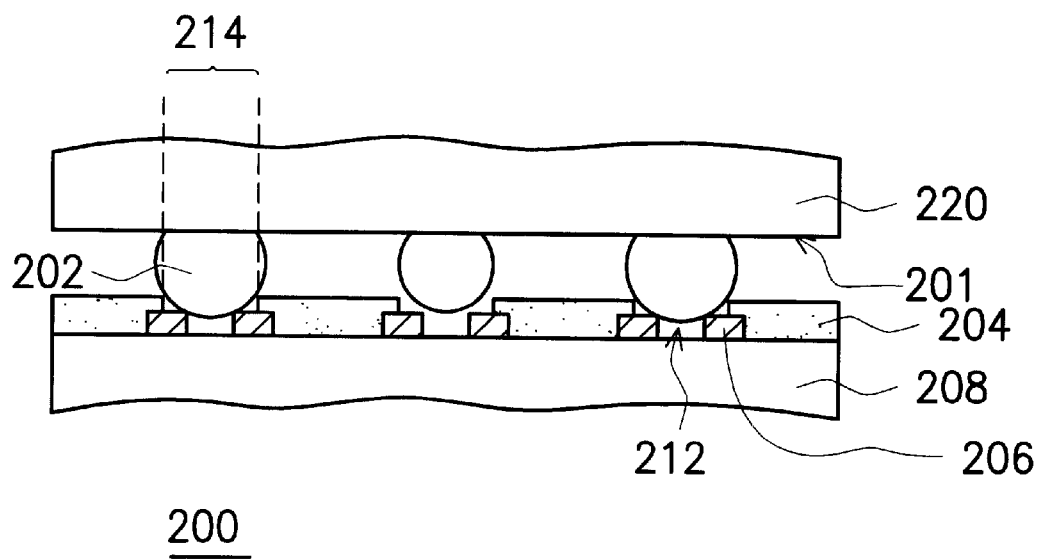
FIG. 4A and FIG. 4B are both a cross-sectional view of a substrate structure of a semiconductor package having bump pad with etching hole taking SMD as an example and applying in a Flip Chip package according to a preferred embodiment of the present invention.
Figure 4B:
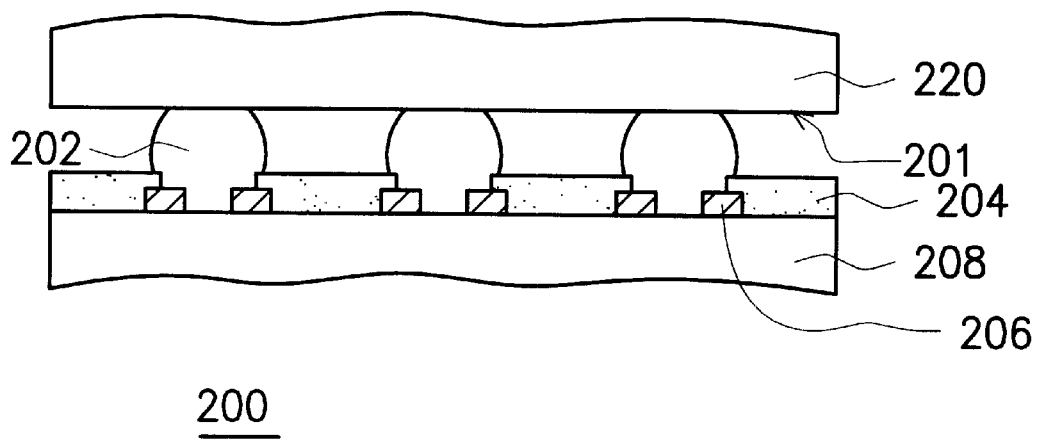

FIG. 4A and FIG. 4B are both a cross-sectional view of a substrate structure of a semiconductor package having bump pad with etching hole taking SMD as an example and applying in a Flip Chip package according to a preferred embodiment of the present invention. As shown in FIG. 4A, a plurality of bumps 202 is formed on the active surface 201 of the chip 220. Then, the chip 220 has its active surface 201 attached to the surface of the substrate 200, wherein the surface of the substrate 200 is the surface that has bump pads 206 disposed thereon, such that the bumps 202 covers exactly on the bump pads 206 respectively to accomplish electrical connection. The solder mask layer 204 covers the surface of the substrate 200 and a portion of the surface of the bump pad 206, and exposes the etching hole 212 and another portion of the surface of the bump pad 206 that is for electrical connection. Therefore, there is no left-offset or right-offset as far as the bump attachment to the bump pads is concerned. Even though the bump has error in coplanarity, the fact that the bump pads 206 have etching holes 212 which allows bumps 202 to penetrate into the etching holes 212 can increase the contact area between the bumps 202 and the bump pads 206.

As shown in FIG. 4B, the bump pads 206 having etching holes 212 is performed a Reflow process. Take a Pb-Sn (Lead-Tin) bump for example, the bumps 202 are heated to a temperature high than 180 degree Celsius to let it melt so that the melted bump 202 fills the etching hole 212 and is collapsed. In this way, the contact area between each of the bumps 202 and each of the bump pads 206 is increased, consequently, the electrical connectivity is improved and the elevation off-set problem due to the coplanarity can be avoided.

Figure 5A:
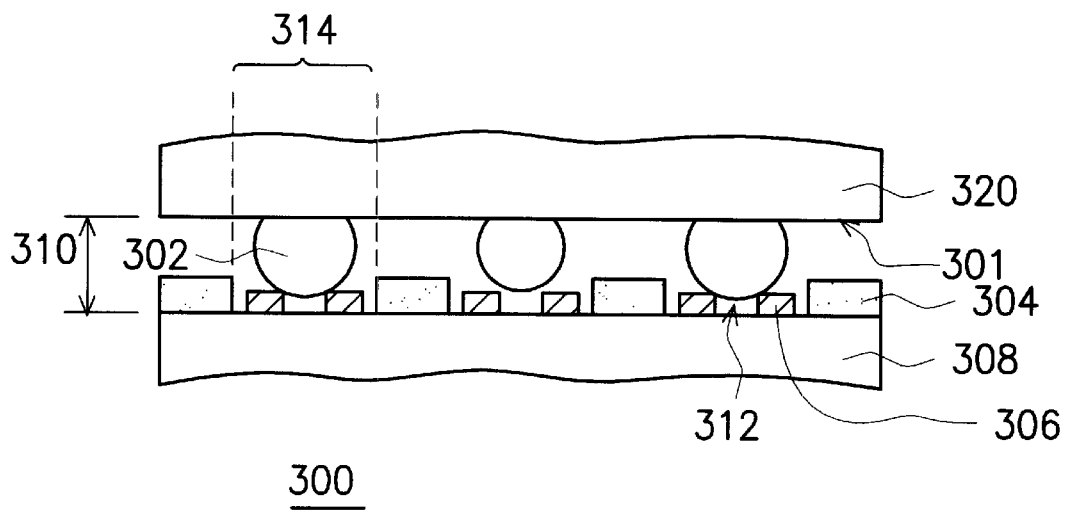
FIG. 5A and FIG. 5B are both a cross-sectional view of a substrate structure of a semiconductor package having bump pad with etching hole taking NSMD as an example and applying in a Flip:Chip package according to a preferred embodiment of the present invention.
Figure 5B:
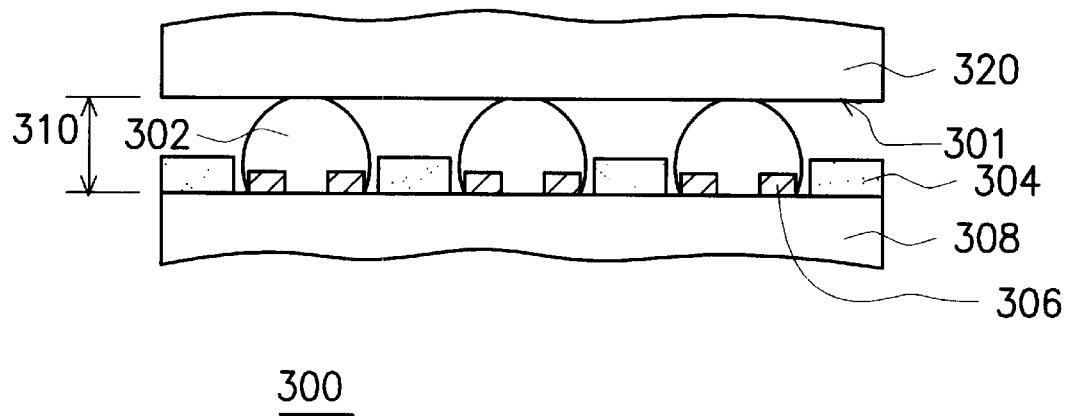

FIG. 5A and FIG. 5B are both a cross-sectional view of a substrate structure of a semiconductor package having bump pad with etching hole taking NSMD as an example and applying in a Flip Chip package according to a preferred embodiment of the present invention. As shown in FIG. 5A, similarly, a plurality of bumps 302 is formed on the active surface 301 of the chip 320. Then, the chip 320 has its active surface 301 attached to the surface of the substrate 300, wherein the surface of the substrate 300 is the surface that has bump pads 306 disposed thereon, such that the bumps 302 covers exactly on the bump pads 306 respectively to accomplish electrical connection. Since the solder mask layer 304 covers the surface of the substrate 300, and exposes the etching hole 312 and the bump pad 306, also a clearance between the edge of the pad opening 314 and the edge of the bump pad 306 is reserved, the contact area between the bumps 302 and the bump pads 306 is increased.

As shown in FIG. 5B, the bump pads 306 having etching holes 312 is performed a Reflow process. Take a Pb-Sn (Lead-Tin) bump for example, the bumps 302 are heated to a temperature high than 180 degree Celsius to let it melt. The melted bump 302 will then fill the etching hole 312 and the clearance reserved between the edge of the pad opening 314 and the edge of the bump pad 306, and the melted bump is collapsed. In this way, the contact area between each of the bumps 302 and each of the bump pads 306 including the top and side surfaces as well as the interior surface is increased, consequently, the electrical connectivity is improved and the elevation off-set problem due to the coplanarity can be avoided.

Figure 6A:
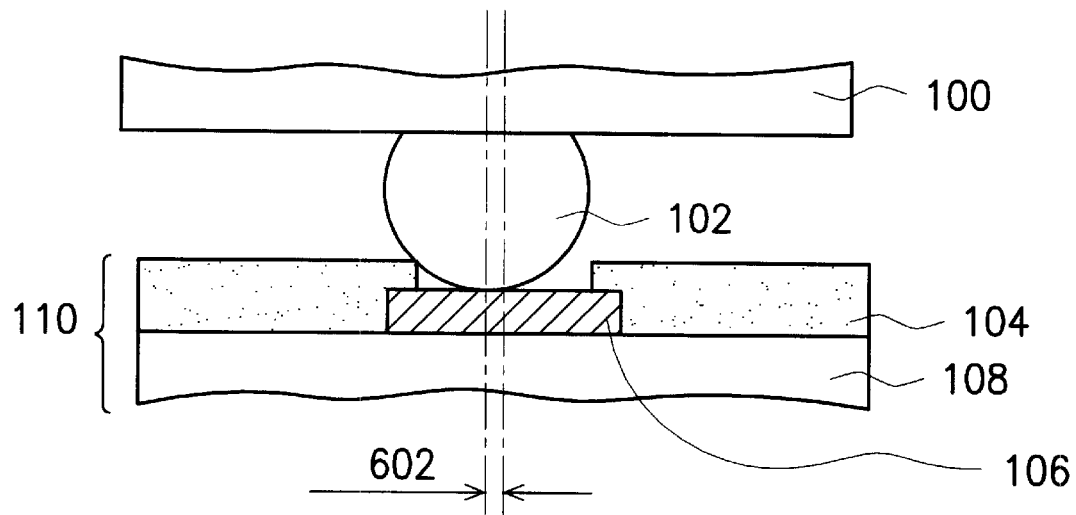
FIG. 6A is a schematic cross-sectional view showing the alignment between the bump and the bump pad of a substrate of semiconductor package for Flip Chip package taking SMD as an example according to the prior art.

Besides, an underfill material is filled between the chip and the substrate to protect the bump from being cracked due to fatigue collapse caused by thermal stress because of the difference in the coefficient of thermal expansion between the chip and the substrate. Moreover, since the bumps can penetrate into the etching holes, and the bumps are collapsed after the Reflow process, the contact area between the bumps and the bump pads can be increased. Therefore, the solder joint reliability can be improved, and the error due to the coplanarity problem of the bumps can be avoided that can reduce the electrical contact resistance between the bumps and the bump pads FIG. 6A is a schematic cross-sectional view showing the alignment between the bump and the bump pad of a substrate of semiconductor package for Flip Chip package taking SMD as an example according to the prior art. As shown in FIG. 6A, in the Flip Chip package, the Pb-Sn bumps 102 are in ball shape, thus when the chip 100 is attached to the substrate, the bumps 102 may have an offset amount 602 either left-offset or right-offset. An elevation offset may also occur due to the coplanarity problem.

Figure 6B:
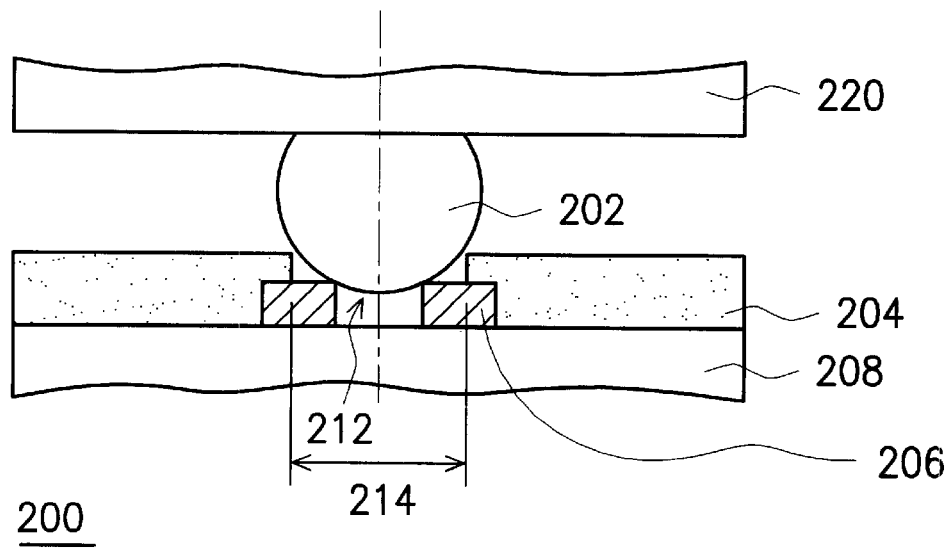
FIG. 6B is a schematic cross-sectional view: showing the alignment between the bump and the bump pad of a substrate of semiconductor package for Flip Chip package taking SMD as an example according to a preferred embodiment of the present invention.

FIG. 6B is a schematic cross-sectional view showing the alignment between the bump and the bump pad of a substrate of semiconductor package for Flip Chip package taking SMD as an example according to a preferred embodiment of the present invention. As shown in FIG. 6B. the substrate structure of the semiconductor package of the present invention has etching hole 212 positioned at the bump pads 206. The substrate structure makes use of the alignment between the center line of the bump 202 and the center line of the etching hole 212 to increase the accuracy that facilitates the subsequent Reflow process.

Figure 7:
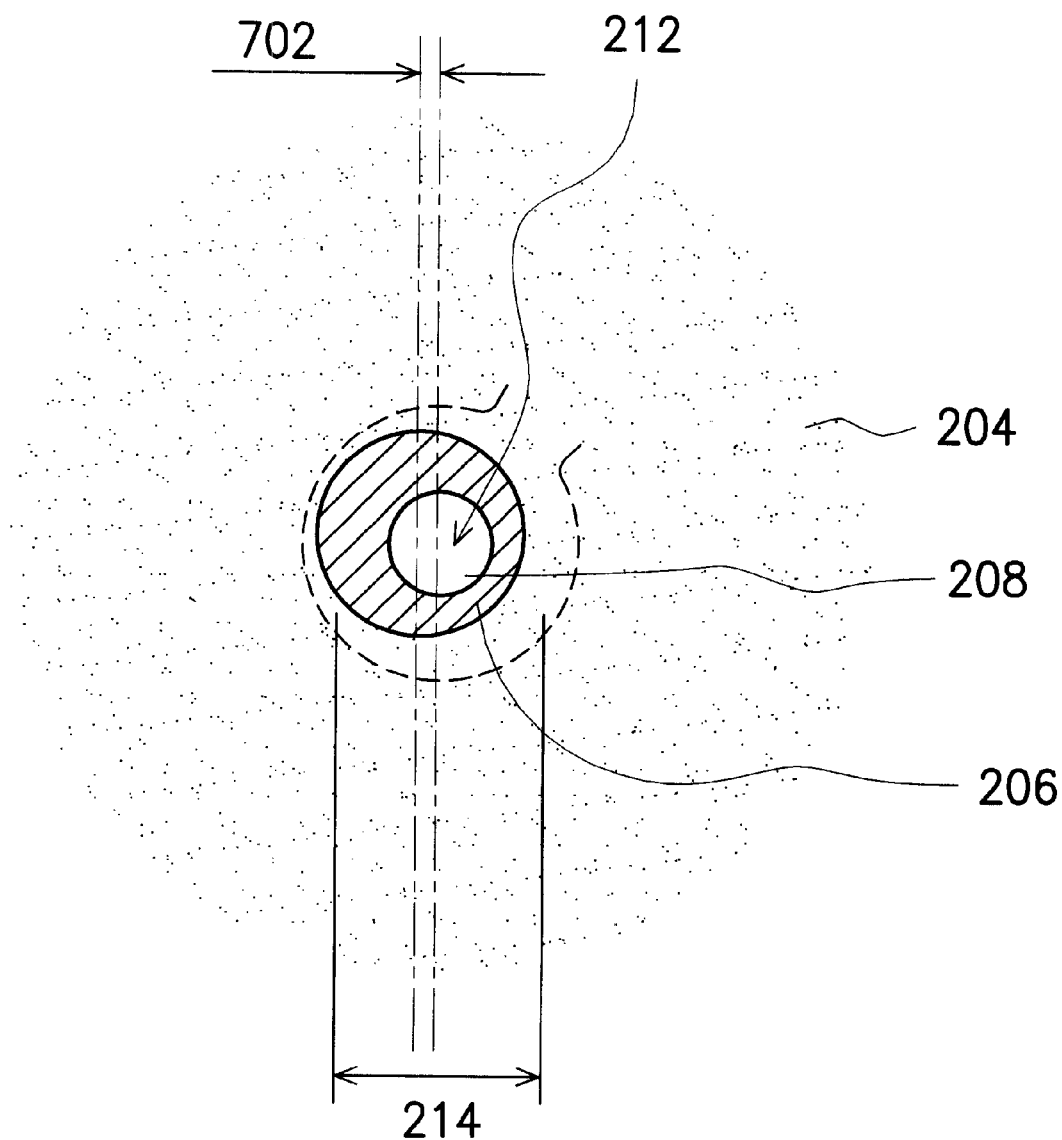
FIG. 7 is a schematic plan view showing the offset of the pad opening of semiconductor package taking SMD as an example according to a preferred embodiment of the present invention.

FIG. 7 is a schematic plan view showing the offset of the pad opening of semiconductor package taking SMD as an example according to a preferred embodiment of the present invention. As shown in FIG. 7, in case there is an offset in the pad opening, the package quality is not affected since the total contact area is still unchanged, and same situation can be applied in the NSMD type of bump pad design of the substrate.

To summarize the foregoing illustration disclosed by preferred embodiments of the present invention, the substrate of semiconductor package for Flip Chip package of the present invention increases the contact area between the bumps and the bump pads to improve the solder joint reliability and the yield of the product, as well as increase the reliability. Moreover, the accuracy of alignment is improved since the substrate structure makes use of the center line of bumps to align with the center line of the etching hole. Besides, the substrate structure can make the bump penetrate into the etching hole to increase the chance of area contact between the bump and the bump pad and reduce the impact to the solder joint due to the coplanar error. Therefore, the problems of being bad in contact between the bump and the bump pad and being too big in electrical contact resistance can be improved effectively. Consequently, the yield and the quality are also improved.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A substrate of semiconductor package for Flip Chip package comprising:

at least an insulative core layer and a plurality of patterned circuit layers alternately stacking up each other, and the patterned circuit layers are electrically connected each other, wherein a topmost one of the patterned circuit layers is positioned on a first surface of a topmost insulative core layer, the topmost patterned circuit layer includes a plurality of bump pads, each of the bump pads has an etching hole, each of the bump pads has an upper surface, an outer sidewall surface and an inner sidewall surface inside the etching hole, and the etching hole exposes the first surface of the topmost insulative core layer; and a solder mask layer covering the surface of the patterned circuit layer, the outer sidewall surface of the upper surface of the bump pads, but exposing the inner sidewall surface inside the etching holes and a portion of the upper surface of the bump pads.

2. The substrate of semiconductor package for Flip Chip package of claim 1 wherein the material for the patterned circuit layers comprises copper.

3. The substrate of semiconductor package for Flip Chip package of claim 1 wherein the material for the solder mask layers comprises ultraviolet type of soldering resistant paint.

4. The substrate of semiconductor package for Flip Chip package of claim 1 wherein the material for the solder mask layer comprises thermoset type of soldering resistant paint.

5. A substrate of semiconductor package for Flip Chip package comprising:

at least an insulative core layer and a plurality of patterned circuit layers alternately stacking up each other, and the patterned circuit layers are electrically connected each other, wherein a topmost one of the patterned circuit layers is positioned on a first surface of a topmost insulative core layer, the topmost patterned circuit layer includes a plurality of bump pads, each of the bump pad has an etching hole, each of the bump pads has an upper surface, an outer sidewall surface and an inner sidewall surface inside the etching hole, and the etching hole exposes the first surface of the topmost insulative core layer; and a solder mask layer covering the surface of the topmost patterned circuit layer, but exposing the upper surface, the outer sidewall surface and the inner sidewall surface of the bump pads.

6. The substrate of semiconductor package for Flip Chip package of claim 5 wherein the material for the patterned circuit layers comprises copper.

7. The substrate of semiconductor package for Flip Chip package of claim 5 wherein the material for the solder mask layers comprises ultraviolet type of soldering resistant paint.

8. The substrate of semiconductor package for Flip Chip package of claim 5 wherein the material for the solder mask layer comprises thermoset type of soldering resistant paint.

9. A semiconductor package structure comprising:

a chip having at least an active surface;

a plurality of bumps disposed on the active surface of the chip;

a substrate having a first surface, and comprising at least an insulative core layer and a plurality of patterned circuit layers alternately stacking up each other, wherein the patterned circuit layers are electrically connected each other, a topmost one of the patterned circuit layers being positioned on a first surface of a topmost insulative core layer has a plurality of bump pads while each of the bump pads has an etching hole, and each of the bump pads has an upper surface, an outer sidewall surface and an inner sidewall surface inside the etching hole; and a solder mask layer covering the surface of the topmost patterned circuit layer and the outer sidewall surface of the bump pads, but exposing the inner sidewall surface of the topmost insulative core layer and a portion of the upper surface of the topmost insulative core layer, and the solder mask layer having a plurality of pad openings that exposes the etching holes;

wherein the chip is positioned to have its active surface facing the first surface of the substrate, and each of the bumps is corresponded to and is electrically connected to a corresponding one of the bump pads, and each of the bumps penetrates into the etching hole of said corresponding bump pad and is in direct contact with the first surface of the topmost insulative core layer.

10. The semiconductor package structure of claim 9 wherein the bumps are attached to the top surfaces of the bump pads and the interior surfaces of the etching holes.

11. The semiconductor package structure of claim 9 wherein the material for the solder mask layers comprises ultraviolet type of soldering resistant paint.

12. The semiconductor package structure of claim 9 wherein the material for the solder mask layer comprises thermoset type of soldering resistant paint.

13. A semiconductor package structure comprising:

a chip having at least an active surface;

a plurality of bumps disposed on the active surface of the chip;

a substrate having a first surface, and comprising at least an insulative core layer and a plurality of patterned circuit layers alternately stacking up each other, wherein the patterned circuit layers are electrically connected each other, and a topmost one of the patterned circuit layers being positioned on a first surface of the insulative core layer has a plurality of bump pads while each of the bump pads has an etching hole, wherein each of the bump pads has upper surface, an inner sidewall surface defined by the etching hole and an outer sidewall surface; and a solder mask layer covering the surface of the topmost patterned circuit layer, but exposing the upper surface, an inner sidewall surface and the outer sidewall surface of the bump pads;

wherein the chip is positioned to have its active surface facing the first surface of the substrate, and each of the bumps is corresponded to and is electrically connected to a corresponding one of the bump pads, and each of the bumps penetrates into the etching hole of said corresponding bump pad and is in direct contact with the upper surface, the inner sidewall surface, and the outer sidewall surface of said corresponding bump pad.

14. The semiconductor package structure of claim 13 wherein the bumps are attached to the top surfaces and the side surfaces of the bump pads and the interior surfaces of the etching holes.

15. The semiconductor package structure of claim 13 wherein the material for the solder mask layers comprises ultraviolet type of soldering resistant paint.

16. The semiconductor package structure of claim 13 wherein the material for the solder mask layer comprises thermoset type of soldering resistant paint.

* * * * *